United States Patent
Tamatsuka et al.

(10) Patent No.: US 7,147,711 B2
(45) Date of Patent: *Dec. 12, 2006

(54) METHOD OF PRODUCING SILICON WAFER AND SILICON WAFER

(75) Inventors: Masaro Tamatsuka, Gunma (JP); Wei Feig Qu, Gunma (JP); Norihiro Kobayashi, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 172 days.

This patent is subject to a terminal disclaimer.

(21) Appl. No.: 10/380,818

(22) PCT Filed: Sep. 14, 2001

(86) PCT No.: PCT/JP01/08005

§ 371 (c)(1),
(2), (4) Date: Mar. 18, 2003

(87) PCT Pub. No.: WO02/25716

PCT Pub. Date: Mar. 28, 2002

(65) Prior Publication Data

US 2004/0003769 A1    Jan. 8, 2004

(30) Foreign Application Priority Data

Sep. 20, 2000   (JP)   ............................. 2000-286068

(51) Int. Cl.
*C30B 15/14*   (2006.01)
(52) U.S. Cl. .............................. 117/13; 117/14; 117/36; 117/89
(58) Field of Classification Search .................... 117/2, 117/13, 14, 36, 84, 89
See application file for complete search history.

(56) References Cited

U.S. PATENT DOCUMENTS 6,191,009 B1 *   2/2001   Tamatsuka et al.   ......... 438/471

(Continued)

FOREIGN PATENT DOCUMENTS

JP   58-056344   4/1983

(Continued)

OTHER PUBLICATIONS

Wolf et al., Silicon Processing for the VLSI Era, vol. 1: Processing Technology, Lattice Press, Sunset Beach, CA, USA, pp. 1-72, 1986.*

(Continued)

*Primary Examiner*—Yogendra N. Gupta
*Assistant Examiner*—Thu Khanh T. Nguyen
(74) *Attorney, Agent, or Firm*—Hogan & Hartson LLP (57) ABSTRACT

The present invention provides a method for producing a silicon wafer, which comprises growing a silicon single crystal ingot having a resistivity of 100 Ω·cm or more and an initial interstitial oxygen concentration of 10 to 25 ppma and doped with nitrogen by the Czochralski method, processing the silicon single crystal ingot into a wafer, and subjecting the wafer to a heat treatment so that a residual interstitial oxygen concentration in the wafer should become 8 ppma or less, and a method for producing a silicon wafer, which comprises growing a silicon single crystal ingot having a resistivity of 100 Ω·cm or more and an initial interstitial oxygen concentration of 8 ppma or less and doped with nitrogen by the Czochralski method, processing the silicon single crystal ingot into a wafer, and subjecting the wafer to a heat treatment to form an oxide precipitate layer in a bulk portion of the wafer, as well as silicon wafers produced by these production methods. Thus, there is provided a DZ-IG silicon wafer in which a DZ layer of high quality is formed, and which can maintain high resistivity even if the wafer is subjected to a heat treatment for device production.

16 Claims, 3 Drawing Sheets

U.S. PATENT DOCUMENTS

| | | | |
|---|---|---|---|
| 6,228,164 B1* | 5/2001 | Ammon et al. | 117/19 |
| 6,395,653 B1* | 5/2002 | Obermeier et al. | 438/795 |
| 6,478,883 B1* | 11/2002 | Tamatsuka et al. | 117/20 |
| 6,492,682 B1* | 12/2002 | Akiyama et al. | 257/347 |
| 6,544,656 B1* | 4/2003 | Abe et al. | 117/3 |
| 6,548,035 B1* | 4/2003 | Kimura et al. | 423/328.2 |
| 6,599,603 B1* | 7/2003 | Kato et al. | 428/64.1 |
| 6,673,147 B1* | 1/2004 | Kononchuk et al. | 117/13 |

FOREIGN PATENT DOCUMENTS

| | | |
|---|---|---|
| JP | 58-074594 | 5/1983 |
| JP | 62-202528 | 9/1987 |
| JP | 63-090141 | 4/1988 |
| JP | 05-058788 | 3/1993 |
| JP | 11-322491 | 11/1999 |
| JP | 2000-211995 | 8/2000 |
| WO | WO 00/55397 | 9/2000 |

OTHER PUBLICATIONS

Takao Abe et al., "Dynamic Behavior of Intrinsic Point Defects in FZ and CZ Silicon Crystal", Mat. Res. Soc. Symp. Proc. vol. 262, 1992. pp. 3-13.

K. Aihara et al., "Enhanced Nucleation of Oxide Precipitates During Czochralski Silicon Crystal Growth With Nitrogen Doping", Journal of Applied Physics, vol. 88, No. 6, Sep. 15, 2000, pp. 3705-3707.

* cited by examiner

METHOD OF PRODUCING SILICON WAFER AND SILICON WAFER

TECHNICAL FIELD

The present invention relates to a technique by which a DZ-IG silicon wafer having high resistivity and also having high gettering ability can surely be obtained.

BACKGROUND ART

Silicon wafers of high resistivity produced by the floating zone method (FZ method) have conventionally been used for power devices such as high-voltage power devices and thyristors. However, it is difficult to produce a silicon wafer having a large diameter of 200 mm or more by the FZ method, and the radial resistivity distribution of usual FZ wafers is inferior to that of CZ wafers. Therefore, silicon wafers produced by the CZ method will be promising in the future, because wafers of excellent radial resistivity distribution can be produced by the CZ method, and in addition, wafers of a large size having a diameter of 200 mm or more can sufficiently be produced by the method.

In recent years, in particular, reduction of parasitic capacity is required in semiconductor devices for mobile communications and the latest C-MOS devices. For this reason, a silicon wafer of high resistivity and a large diameter comes to be needed. Moreover, the effect of using a high resistivity substrate on reduction of transmission loss of signals and parasitic capacity in Schottky barrier diodes has been reported. Furthermore, although the so-called SOI (Silicon On Insulator) wafer may be used in order to obtain further higher performance of the aforementioned semiconductor devices, it is required to use a wafer of high resistivity produced by the CZ method as a base wafer even when semiconductor devices are produced by using the SOI wafer in order to obtain a larger diameter of wafer or solve the problem of transmission loss of signals or the like.

However, since the CZ method utilizes a crucible made of quartz, not a small amount of oxygen (interstitial oxygen) is introduced into a silicon crystal. Although each of such oxygen atoms is usually electrically neutral, if they are subjected to a heat treatment at a low temperature of around 350 to 500° C., a plurality of them gather to release electrons and become electrically active oxygen donors. Therefore, if a wafer obtained by the CZ method is subsequently subjected to a heat treatment at about 350 to 500° C. in the device production process and so forth, there arises a problem that resistivity of a high resistivity CZ wafer is reduced due to the formation of the oxygen donors.

In order to prevent the resistivity reduction due to the above oxygen donors and obtain a silicon wafer of high resistivity, methods for producing a silicon single crystal having a low interstitial oxygen concentration from an initial stage of the crystal growth by the magnetic field-applied CZ method (MCZ method) were proposed (refer to Japanese Patent Publication (Kokoku) No. 8-10695 and Japanese Patent Laid-open Publication (Kokai) No. 5-58788). Further, there has also been proposed a method conversely utilizing the phenomenon of the oxygen donor formation, wherein a P-type silicon wafer of a low impurity concentration and low oxygen concentration is subjected to a heat treatment at 400 to 500° C. to generate oxygen donors, and P-type impurities in the P-type silicon wafer is compensated by these oxygen donors so that the wafer should be converted into N-type to produce an N-type silicon wafer of high resistivity (refer to Japanese Patent Publication No. 8-10695).

However, a silicon single crystal of a low interstitial oxygen concentration produced by the MCZ method or the like as mentioned above suffers from a drawback that the density of bulk defects generated by a heat treatment in the device production process becomes low, and thus sufficient gettering effect will be unlikely to be obtained. In devices of a high integration degree, it is essential to impart gettering effect by a certain amount of oxygen precipitation.

Further, the method of obtaining a silicon wafer of N-type by generating oxygen donors by a heat treatment and compensating P-type impurities in the wafer to convert it into N-type is a complicated method that requires a heat treatment for a long period of time. Moreover, this method cannot provide a P-type silicon wafers. In addition, this method also has a drawback that resistivity of wafers obtained by this method may vary depending on a subsequent heat treatment. Furthermore, in this method, in case of high interstitial oxygen concentration, it becomes difficult to control the wafer resistivity. Therefore, this method suffers from a drawback that a low initial concentration of interstitial oxygen in a silicon wafer must be used, and thus the gettering effect of the wafer becomes low.

In order to solve these problems, the applicants of the present application proposed, in a previous application (Japanese Patent Application No. 11-241370, PCT/JP00/01124), a method for producing a silicon wafer, which comprises growing a silicon single crystal ingot having a resistivity of 100 Ω·cm or more and an initial interstitial oxygen concentration of 10 to 25 ppma (JEIDA: Japan Electronic Industry Development Association) by the Czochralski method, processing the silicon single crystal ingot into a wafer, and subjecting the wafer to an oxygen precipitation heat treatment so that a residual interstitial oxygen concentration in the wafer should become 8 ppma or less. According to this method, a CZ wafer of high resistivity of which resistivity is unlikely to decrease even when the wafer is subjected to a heat treatment for device production. Therefore, if this wafer is used as, for example, a base wafer of SOI wafer, devices of extremely high performance for mobile communications can be obtained.

On the other hand, it is considered that, in order to realize a wafer having performance of the same level as the SOI wafer by using a bulk wafer, of which production cost is more inexpensive compared with SOI wafer, so to speak "high resistivity DZ-IG wafer" of a structure having a DZ layer (Denuded Zone layer) sufficiently made defect free on a surface of such a high resistivity CZ wafer is required. Although there has conventionally been the so-called DZ-IG wafer, which is obtained by subjecting a CZ silicon wafer having usual resistivity to a DZ-IG (Intrinsic Gettering) treatment, there has not been conceived to apply this technique to a high resistivity CZ wafer at all. Therefore, the applicant of the present application also disclosed a method for obtaining a high resistivity DZ-IG wafer by a heat treatment that makes the aforementioned interstitial oxygen concentration 8 ppma or less in the previous application (Japanese Patent Application No. 11-241370).

As the DZ-IG treatment applied to a wafer of usual resistivity, a three-step heat treatment is generally used. Supersaturated oxygens in the vicinity of a wafer surface are out-diffused by a first step high temperature heat treatment at 1100° C. or higher, a low temperature heat treatment at around 650° C. is performed as a second step heat treatment to form oxygen precipitation nuclei, and a moderate temperature heat treatment is performed at about 1000° C. as the third step heat treatment to allow growth of the oxide precipitates. By such a three-step heat treatment, an oxide precipitate region is formed in the wafer, and thus a DZ layer in which oxide precipitates do not exist is formed in the vicinity of surface of the front side or back side.

Therefore, the applicants of the present application applied the same heat treatment as the above heat treatment as the heat treatment for obtaining an interstitial oxygen concentration of 8 ppma or less. As a result, it was found that a high resistivity DZ-IG wafer having a high resistivity of 100 Ω·cm or more and having a DZ layer free from crystal defects near the surface and an oxide precipitate layer in which oxide precipitates are sufficiently precipitated could be obtained.

It was considered that such a high resistivity DZ-IG wafer could sufficiently serve as an alternative of SOI wafers for mobile communications. However, subsequent investigations revealed that, if such a DZ-IG wafer was subjected to a heat treatment during the device production process, the resistivity near the wafer surface was extremely reduced as the case may be, and thus sufficient high resistivity may not be obtained.

Further, it was also found that, although the DZ layer formed by such a heat treatment was surely made defect free as for defects originated from oxide precipitates, grown-in defects called COP (Crystal Originated Particle) were not eliminated and still remained.

COP is a void of 0.1 μm order size formed by aggregation of excessive vacancies during the growth of CZ silicon single crystals, and the internal surface thereof is covered with a thin oxide film. Further, it is known that, if a device is formed on a portion where such grown-in defects exist, device characteristics such as oxide dielectric breakdown voltage are degraded.

DISCLOSURE OF THE INVENTION

The present invention was accomplished in order to solve these problems, and its object is to provide a method for producing a silicon wafer in which a DZ layer of high quality made defect free not only for oxide precipitates but also for COPs is formed in the vicinity of the wafer surface, oxide precipitates are formed in the bulk portion at a sufficient density and thereby high gettering ability can be obtained, and which can maintain high resistivity even after the wafer is subjected to a heat treatment for device production, and thereby provide a high resistivity DZ-IG wafer of high quality at a thus-far unknown level, which can serve as an alternative of SOI wafer for mobile communications.

In order to achieve the aforementioned object, the present invention provides a method for producing a silicon wafer, which comprises growing a silicon single crystal ingot having a resistivity of 100 Ω·cm or more and an initial interstitial oxygen concentration of 10 to 25 ppma and doped with nitrogen by the Czochralski method, processing the silicon single crystal ingot into a wafer, and subjecting the wafer to a heat treatment so that a residual interstitial oxygen concentration in the wafer should become 8 ppma or less.

If nitrogen is doped in a silicon single crystal as described above, sizes of grown-in defects (COPs) become small, and it becomes easy to eliminate them by a heat treatment. In addition, formation and growth of oxygen precipitation nuclei can be attained to a certain degree during the crystal growth. Thus, it becomes possible to form a DZ layer of high quality by a heat treatment at a temperature lower than that of the conventional DZ-IG treatment by a three-step heat treatment (formation of DZ layer (high temperature)+formation of precipitation nuclei (low temperature)+growth of precipitates (moderate temperature)), and it also becomes possible to grow oxide precipitates of a sufficient density in the bulk portion by a heat treatment for a short period of time. Therefore, the transition region between the DZ layer and the oxide precipitate region can be made to have a narrow and sharp profile, and the amount of interstitial oxygen in the whole transition region can be made small. Thus, the influence of oxygen acting as donor can be reduced. Furthermore, it also becomes possible to enlarge the acceptable range of the initial interstitial oxygen concentration that can provide an interstitial oxygen concentration of 8 ppma (JEIDA: Japan Electronic Industry Development Association Standard) or less for a specific heat treatment.

The present invention also provides a method for producing a silicon wafer, which comprises growing a silicon single crystal ingot having a resistivity of 100 Ω·cm or more and an initial interstitial oxygen concentration of 8 ppma or less and doped with nitrogen by the Czochralski method, processing the silicon single crystal ingot into a wafer, and subjecting the wafer to a heat treatment to form an oxide precipitate layer in a bulk portion of the wafer.

If nitrogen is doped in a silicon single crystal as described above, the oxygen precipitation is more promoted when the wafer is subjected to an oxygen precipitation heat treatment compared with a wafer not doped with nitrogen, even if the wafer is a wafer of low oxygen content having an initial interstitial oxygen concentration of 8 ppma or less, and thus it becomes possible to form oxide precipitates at a sufficient density. Moreover, since the wafer contains oxygen at a low concentration, the oxide films on the internal surfaces of COPs formed during the crystal growth become thin, and it becomes easy to eliminate COPs by a heat treatment. For these reasons, it becomes possible to form a DZ layer of high quality and oxide precipitates at a sufficient density in the bulk portion by a heat treatment at a relatively lower temperature for a shorter period of time compared with those used in the conventional techniques. Furthermore, since the interstitial oxygen concentration is originally 8 ppma or less, substantially no fluctuation of resistivity due to oxygen acting as donor is caused in the device production process. Moreover, the method also has an advantage that the problem of low resistance of the wafer to slip dislocations generated by a heat treatment due to the low oxygen concentration in a wafer not doped with nitrogen can also be covered by the use of the milder heat treatment conditions (low temperature and short time).

In the aforementioned methods, nitrogen is preferably doped at a concentration of $1 \times 10^{12}$ to $5 \times 10^{15}$ number/cm$^3$.

This is because, if the nitrogen concentration is less than $1 \times 10^{12}$ number/cm$^3$, the effect is not so remarkable compared with a case not using the nitrogen doping, and if it exceeds $5 \times 10^{15}$ number/cm$^3$, the single crystallization during the pulling of the crystal may be inhibited, or it may make continuous operation unstable. More preferably, the nitrogen concentration should be less than $1 \times 10^{14}$ number/cm$^3$. This is because, if the nitrogen concentration is $1 \times 10^{14}$ number/cm$^3$ or more, the amount of oxygen-nitrogen donors formed by a heat treatment at around 600° C. increases, and they may reduce the resistivity. That is, it is known that about 10% of the doped nitrogen contributes to the formation of oxygen-nitrogen donors, and a doping amount of $1 \times 10^{14}$ number/cm$^3$ may form $1 \times 10^{13}$ number/cm$^3$ of oxygen-nitrogen donors. If all of these donors are activated, there is caused fluctuation of the resistivity in the order of several hundreds Ω·cm. However, it can be conversely said that, if the amount of the generated donors is the above level or less, they show substantially no influence.

Further, in the aforementioned method, the heat treatment is preferably performed at a temperature of 1000 to 1200° C. for 1 to 20 hours in hydrogen gas, argon gas or a mixed gas atmosphere of hydrogen gas and argon gas.

If the heat treatment is performed in hydrogen gas, argon gas or a mixed gas atmosphere thereof as described above, grown-in defects at the wafer surface and in the vicinity of the wafer surface can be effectively eliminated, and the oxide precipitates in the bulk portion can be grown at the same time. In this case, if the heat treatment temperature is lower than 1000° C., a heat treatment for a long period of time exceeding 20 hours is required in order to sufficiently eliminate the grown-in defects. Further, although the grown-in defects can be sufficiently eliminated by a heat treatment for about 1 hour at a heat treatment temperature of 1200° C., if the temperature exceeds 1200° C., the oxygen precipitation nuclei formed by the effect of the nitrogen doping during the crystal growth become likely to melt again, and thus it becomes difficult to obtain a sufficient oxide precipitate density after the heat treatment. Therefore, the heat treatment temperature is preferably 1000 to 1200° C.

A silicon wafer produced by the production method of the present invention described above has a high resistivity of 100 Ω·cm or more and a low interstitial oxygen concentration of 8 ppma or less. Therefore, it can be a high resistivity DZ-IG wafer of high quality in which resistivity is not reduced by oxygen acting as donor during the device production process, and which contains substantially no grown-in defect in the DZ layer near the wafer surface.

As explained above, according to the present invention, there can be obtained a CZ silicon wafer in which fluctuation of resistivity due to interstitial oxygen acting as donor is suppressed even after the wafer is subjected to a heat treatment for device production. This effect is extremely effective for a high resistivity CZ wafer having a resistivity of 100 Ω·cm or more, and it enables use of the wafer as an alternative of SOI wafer for mobile communications.

BEST MODE FOR CARRYING OUT THE INVENTION

Hereafter, the present invention will be explained in detail.

As described above, in order to obtain a "high resistivity DZ-IG wafer" that can realize, as a bulk wafer, performance at a level equivalent to that of an SOI wafer for mobile communications utilizing a high resistivity wafer as the base wafer, the inventors of the present invention applied a three-step heat treatment usually performed as a heat treatment for obtaining an interstitial oxygen concentration of 8 ppma or less to a CZ silicon wafer of high resistivity as a trial. The heat treatment of the third step for growing oxide precipitates was performed by divided two stages at temperatures of 800° C. and 1000° C.

Figure 3:
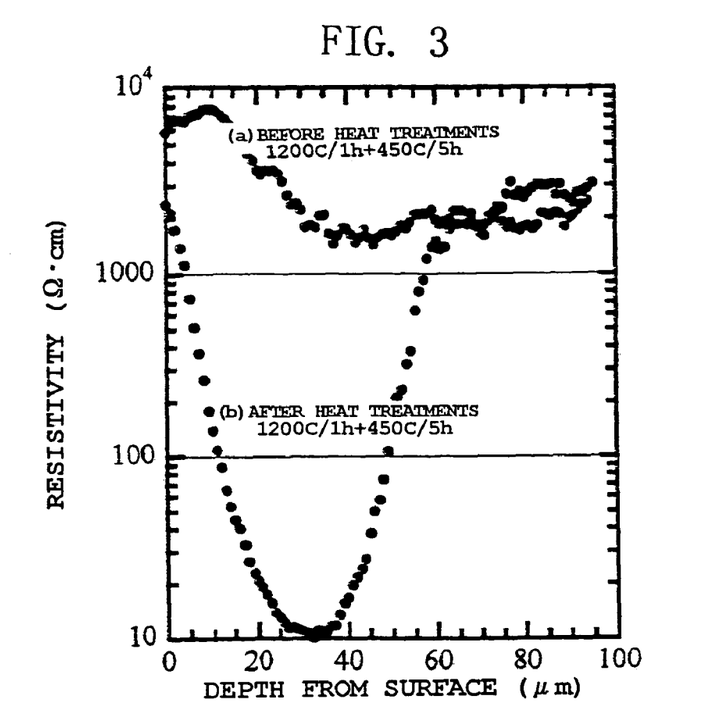
FIG. 3 is a graph showing the relationship between the depth from surface and the resistivities before and after heat treatment in a conventional silicon wafer.

As a result, in the wafer immediately after the three-step heat treatment, a DZ layer was formed in the vicinity of the wafer surface while the high resistivity was maintained, and an IG layer (oxide precipitate region) was formed in the bulk portion. Thus, a desired high resistivity DZ-IG wafer was obtained (FIG. 3(a)). However, when a heat treatment simulating a device production heat treatment was applied to this wafer, it was found that the resistivity might extremely decreased in the vicinity of the wafer surface as the case may be (FIG. 3(b)).

Figure 4:
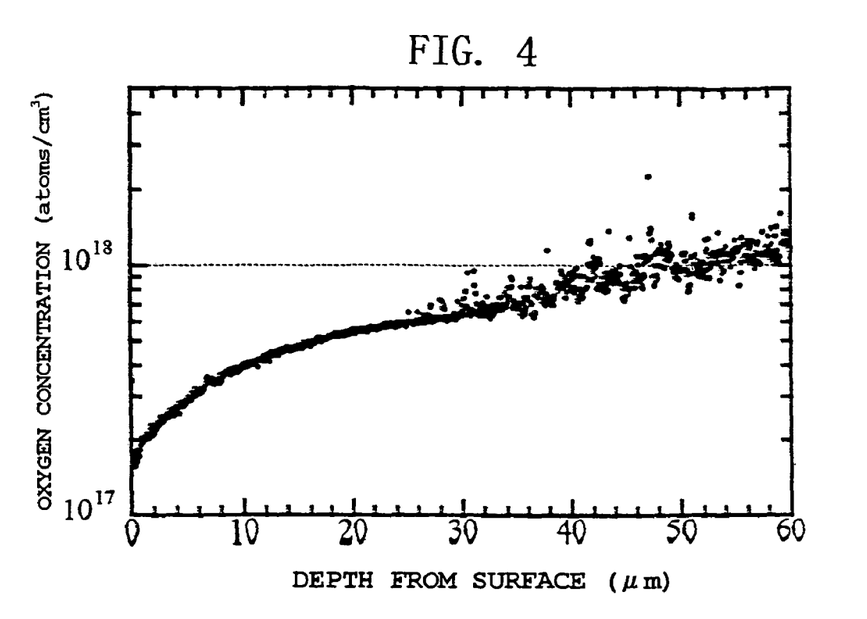
FIG. 4 is a graph showing the relationship between the depth from surface and the absolute value of oxygen concentration in a conventional silicon wafer.

It was expected that the resistivity decrease was caused because interstitial oxygen existing in the wafer became donor. Therefore, the inventors of the present invention measured and examined distribution of absolute value of oxygen concentration along the depth direction in a wafer after the three-step heat treatment, in which the resistivity decreased, by using a secondary ion mass spectroscopy (SIMS) apparatus (FIG. 4). Further, the wafer was subjected to angle polishing and preferential etching, and then distribution of oxide precipitates (etch pits) along the depth direction was observed. The results are schematically shown in FIG. 5.

Figure 5:
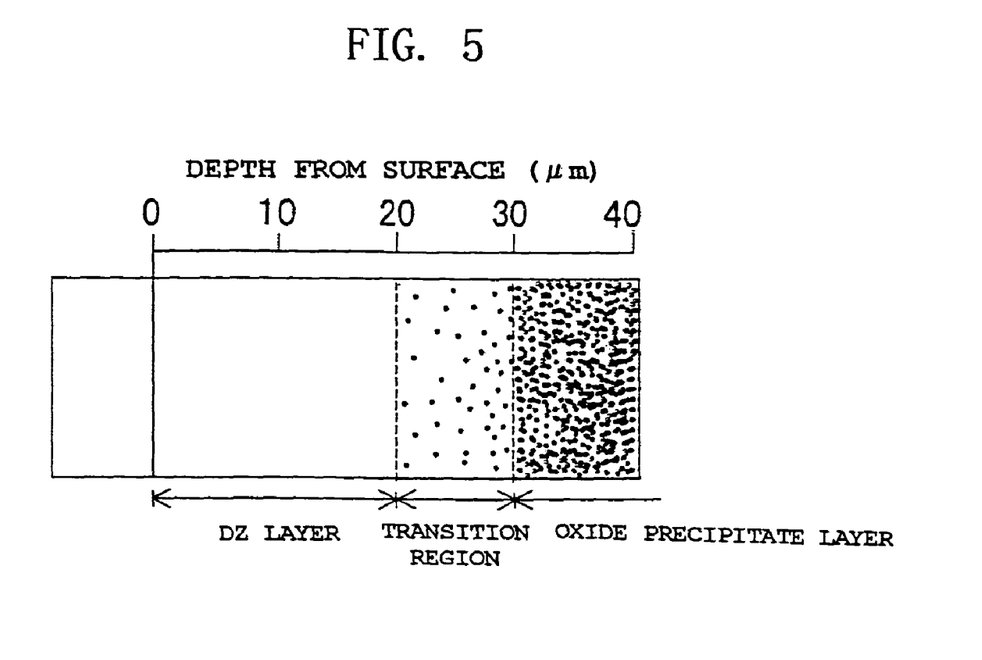
FIG. 5 is a schematic view showing precipitate distribution along the depth direction in a conventional silicon wafer.

From the results shown in FIGS. 4 and 5, it can be seen that a region of about 20 μm from the surface is the DZ layer, a deeper region of a depth of about 30 μm or more from the surface is the oxide precipitate layer, and a region between them of a depth of about 20 to 30 μm from the surface is the transition region (a region that does not fully become a DZ layer, in which a few oxide precipitates exist) in the wafer referred to in FIG. 4. A region around the transition region corresponded to a region in which resistivity was extremely decreased after the heat treatment simulating a device production heat treatment. When the interstitial oxygen concentration in this region was measured later by infrared absorption spectroscopy, it was found to be a portion where the interstitial oxygen concentration exceeded 8 ppma ($4 \times 10^{17}$ atoms/cm$^3$).

Furthermore, when COPs in a region of a depth of several micrometers from the surface were measured by using a particle counter before and after the three-step heat treatment, there is almost no change was observed, and thus it was confirmed that COPs remained in the wafer surface portion.

That is, it is considered that, even if the interstitial oxygen in the DZ layer near the surface is out-diffused, and the interstitial oxygen concentration in the bulk portion becomes sufficiently low due to precipitation of oxygen as oxide precipitates, the interstitial oxygen concentration is still high in the transition region between them even after the three-step heat treatment, and therefore the resistivity is decreased by oxygen becoming donor.

Therefore, it was considered that, for the purpose of surely obtaining a high resistivity DZ-IG wafer, the interstitial oxygen concentration of not only the DZ layer and the oxide precipitate layer but also the transition region between the both should be made to be 8 ppma or less, or if the aforementioned transition region could be made to have a width as narrow as possible and a profile as sharp as possible, the amount of interstitial oxygen as the whole transition region would become small, and thus the influence of oxygen that became donor could also be made small. In addition, it was also considered that it was necessary to decrease COPs in the DZ layer.

Therefore, the inventors of the present invention investigated production conditions for a silicon wafer that satisfy these requirements. As a result, they conceived doping of a silicon single crystal with nitrogen during the growth of the crystal by the CZ method. That is, it has been pointed out that, if nitrogen is doped in a silicon single crystal, the aggregation of oxygen atoms in the silicon is promoted, and thus the oxide precipitate density increases (T. Abe and H. Takeno, Mat. Res. Soc. Symp. Proc. Vol. 262, 3, 1992). It is thought that this effect is obtained because the aggregation process of oxygen atoms is shifted from that consisting of homogenous nucleus formation to that consisting of heterogenous nucleus formation utilizing nitrogen impurities as nuclei. Furthermore, it is also known that, if nitrogen is doped in a single crystal, sizes of crystal defects such as COPs become small.

Therefore, if a silicon single crystal is doped with nitrogen during the growth thereof, formation and growth of oxygen precipitation nuclei can be attained to a certain extent during the crystal growth, thus it is expected that the precipitation of interstitial oxygen is promoted also in the transition region between the DZ layer and the oxide precipitate layer to sufficiently reduce the interstitial oxygen concentration, and it is considered that the width of the transition region can be narrowed so that the region should have a sharp profile. Further, it is considered that, since sizes of grown-in defects such as COPs are made small by the nitrogen doping, it becomes easier to eliminate them by a subsequent heat treatment. Therefore, the inventors of the present invention performed the following experiments concerning nitrogen-doped CZ wafers.

EXPERIMENTAL EXAMPLE 1

Figure 1:
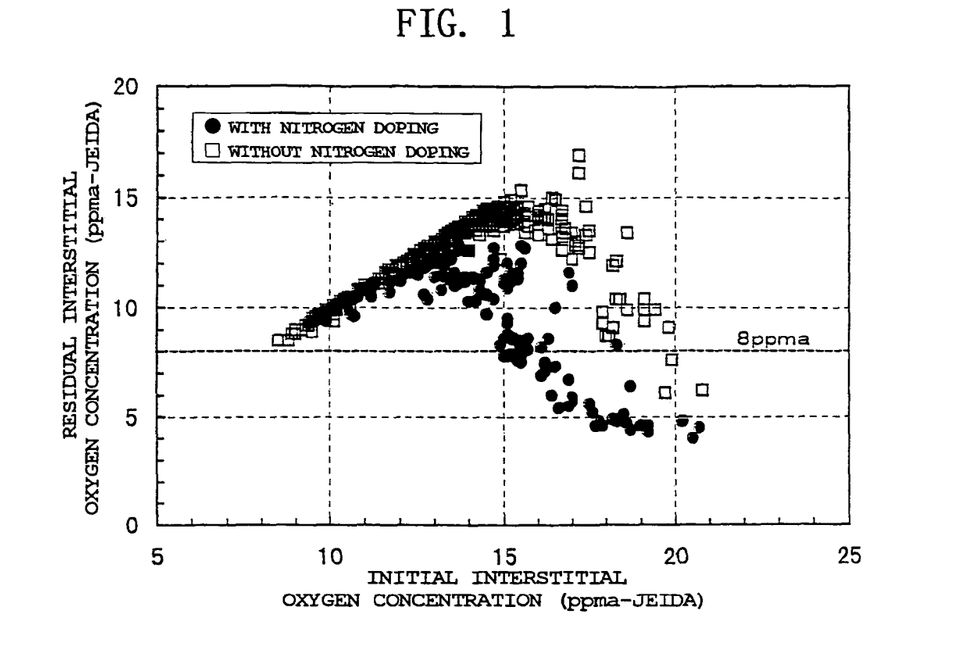
FIG. 1 is a graph representing experimental results showing the relationship between the initial interstitial oxygen concentration and the residual interstitial oxygen concentration of a CZ wafer subjected to a usual oxygen precipitation heat treatment.

FIG. 1 shows experimental results representing relationship between the initial interstitial oxygen concentration and the residual interstitial oxygen concentration in various CZ wafers having an initial interstitial oxygen concentration of 8 to 21 ppma after they were subjected to usual heat treatments for oxygen precipitation, i.e., a heat treatment at 780° C. for 3 hours and a heat treatment at 1000° C. for 16 hours under a nitrogen atmosphere (containing 3% of oxygen). Two kinds of the nitrogen concentrations, i.e., $1 \times 10^{13}$ to $9 \times 10^{13}$ number/cm$^3$ and no nitrogen doping, were used.

From the results shown in FIG. 1, it can be seen that if nitrogen is not doped, the residual interstitial oxygen concentration cannot be made 8 ppma or less after the aforementioned heat treatments unless the initial interstitial oxygen concentration is 19 ppma or more, whereas if nitrogen is doped, the range of acceptable initial interstitial oxygen concentration is enlarged to the range of 15 ppma or more. Further, it was confirmed that, by using a longer heat treatment time, the range of acceptable initial interstitial oxygen concentration could be enlarged to the range of 10 ppma or more.

EXPERIMENTAL EXAMPLE 2

Figure 2:
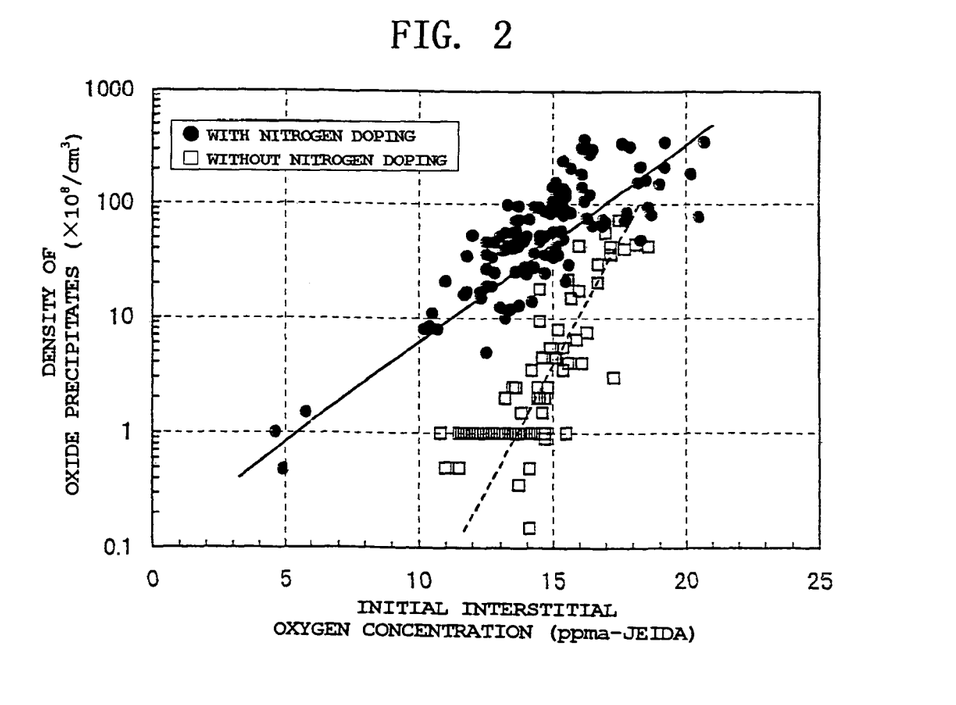
FIG. 2 is a graph representing experimental results showing the relationship between the initial interstitial oxygen concentration and the density of precipitates of a CZ wafer subjected to a usual oxygen precipitation heat treatment.

FIG. 2 shows experimental results representing relationship between the initial interstitial oxygen concentration and the density of precipitates in various CZ wafers having an initial interstitial oxygen concentration of 4 to 19 ppma after they are subjected to usual heat treatments for oxygen precipitation, i.e., a heat treatment at 780° C. for 3 hours and a heat treatment at 1000° C. for 16 hours under a nitrogen atmosphere (containing 3% of oxygen), angle polishing and preferential etching, in which the measured density of precipitates in the oxygen precipitation region was converted into volume density. Two kinds of the nitrogen concentrations, i.e., $1 \times 10^{13}$ to $9 \times 10^{13}$ number/cm$^3$ and no nitrogen doping, were used.

From the results shown in FIG. 2, it can be seen that the oxide precipitate density is markedly increased by the nitrogen doping, even if the initial interstitial oxygen concentration is the same. It can be seen that, in particular, even with a low initial interstitial oxygen concentration of 8 ppma or less, a precipitate density of $1 \times 10^8$ number/cm$^3$ can be obtained by the nitrogen doping.

Based on the results shown in FIG. 1 mentioned above, it is considered that it is expected that oxide precipitates are not substantially formed in a non-nitrogen-doped wafer of a low oxygen concentration having an initial interstitial oxygen concentration of 8 ppma or less, but when nitrogen was doped, oxygen precipitation nuclei (oxide precipitates) stable at a high temperature had been already formed in the as-grown state, and therefore oxide precipitates having sizes detectable as oxide precipitates were obtained even by an extremely small degree of nucleus growth in such an extent that the growth could not be detected as an amount of precipitated oxygen after the subsequent heat treatment.

From these results, it is expected that, as for wafers obtained from a single crystal having an initial interstitial oxygen concentration of about 10 to 25 ppma, if the crystal is grown with nitrogen doping, the oxygen precipitation is promoted during the subsequent heat treatment for oxygen precipitation, thus the residual interstitial oxygen concentration can be reduced also in the transition region, and a sufficiently narrow and sharp profile of the transition region can be obtained. Further, it can be seen that, as also for wafers obtained from a single crystal having an initial interstitial oxygen concentration of 8 ppma or less, if nitrogen is doped, sufficient oxygen precipitation can be obtained by the subsequent heat treatment for oxygen, and sufficient gettering effect can be secured.

Further, although the quality of the DZ layer, especially the presence or absence of COP, was not evaluated in the experiments described above, it is known that sizes of COPs are made smaller by nitrogen doping, and thus it becomes easier to eliminate them by a heat treatment. Therefore, the inventors of the present invention considered that, if elimination of COPs and formation of oxide precipitates were performed simultaneously under conditions under which COPs were easily eliminated, and oxide precipitates are sufficiently formed, i.e., by using a temperature not so high as the DZ formation heat treatment of the conventional three-step heat treatment (high temperature heat treatment) instead of the heat treatments used in the aforementioned experiments, the transition region could be made to have a narrow width and a sharp profile, as a result, high resistivity could be maintained, and the desired CZ silicon wafer could eventually be obtained, and they accomplished the present invention.

The present inventions will be further explained hereafter. However, the present invention is not limited by these explanations.

First, a silicon single crystal ingot is pulled by the known CZ method or the known MCZ method where a single crystal is pulled while a magnetic field is applied to a melt in the CZ method to control convection of the silicon melt, so that the silicon single crystal ingot should have a desired high resistivity of 100 Ω·cm or more and an initial interstitial oxygen concentration of 10 to 25 ppma. These pulling methods are methods comprising bringing a seed crystal into contact with a melt of polycrystalline silicon raw material contained in a quartz crucible and slowly pulling the seed crystal with rotation to allow growth of a single crystal ingot of a desired diameter. A desired initial interstitial oxygen concentration can be obtained by using conventional techniques. For example, a crystal having a desired oxygen concentration can be obtained by suitably adjusting parameters such as rotational speed of the crucible, flow rate of introduced gas, atmospheric pressure, temperature distribution and convection of silicon melt and strength of the magnetic field to be applied.

In order to pull a silicon single crystal having an initial interstitial oxygen concentration of 8 ppma or less (also referred to as "low oxygen concentration" hereafter), the parameters to be controlled during the crystal growth are similar to those for the case where the interstitial oxygen concentration is 10 to 25 ppma (also referred to as "high oxygen concentration" hereafter) is pulled as mentioned above. However, in order to stably pull such a crystal of low oxygen concentration, the MCZ method is usually used.

The simultaneous doping with nitrogen as well as oxygen can be easily performed by preliminarily adding nitride such as wafers having nitride films into the raw material polycrystal contained in a quartz crucible. The concentration of nitrogen to be doped in a pulled crystal can be calculated from the amount of nitride introduced into the raw material polycrystal or crucible, the segregation coefficient of nitrogen and so forth.

The CZ silicon single crystal ingot obtained as described above is sliced by using a cutting machine such as a wire saw or inner diameter slicer, and subjected to steps of chamfering, lapping, etching, polishing and so forth to be processed into CZ silicon single crystal wafers according to conventional techniques. Of course, these steps are mere examples, and there may be used various other steps such as cleaning step and heat treatment step. Further, the steps are used with suitable modification including the alteration of the order of steps, omission of some steps and so forth according to the purpose.

Then, to a wafer of high oxygen concentration, a heat treatment that provides a residual interstitial oxygen concentration of 8 ppma or less is applied. The heat treatment that provides a residual interstitial oxygen concentration of 8 ppma or less used in this case cannot be necessarily specified, because the residual interstitial oxygen concentration varies depending on the initial interstitial oxygen concentration and thermal history during crystal growth of a wafer to be subjected to a heat treatment. However, it can be determined by experiments according to the initial interstitial oxygen concentration, thermal history and so forth.

In addition, in the present invention, not only the formation of oxide precipitates by a heat treatment, but also elimination of COPs by a heat treatment must be considered. The heat treatment for eliminating COPs is preferably a heat treatment at a high temperature in hydrogen gas, argon gas or a mixed gas thereof. However, at an unduly high temperature, there arise problems that oxide precipitates become unlikely to be formed, and the width of the transition region is broadened. Therefore, the heat treatment temperature is preferably 1000 to 1200° C. Even with such a relatively low temperature, COPs can be sufficiently eliminated, because the sizes of COPs are made small by the effect of the nitrogen doping, and interstitial oxygen can also be reduced by out-diffusion thereof. Further, if hydrogen gas, argon gas or a mixed gas thereof is used, the out-diffusion profile of oxygen abruptly changes at the wafer surface, and thus a transition region having a sharper profile can be formed.

The aforementioned heat treatment can also be dividedly performed, for example, with two stages at 1200° C. and 1000° C., to sufficiently eliminate COPs at a high temperature of the first stage, and then sufficiently grow oxide precipitates at a low temperature of the second stage.

On the other hand, as for a wafer of low oxygen concentration, change of resistivity depending on the width of the transition region need not be considered, COPs can be easily eliminated by a heat treatment at a temperature as high as possible within a range that provides sufficient formation of oxide precipitates. However, in order to obtain sufficient oxygen precipitates, the temperature is preferably 1000 to 1200° C.

These heat treatments can be performed by using a usual vertical type furnace or a usual horizontal type furnace (diffusion furnace), which enables a simultaneous heat treatment of many wafers.

The present invention will be specifically explained hereafter with reference to the following examples of the present invention and comparative examples. However, the present invention is not limited by these.

EXAMPLE 1

Silicon wafers having nitride films were introduced into raw material polycrystal, and a nitrogen-doped silicon single crystal was pulled by the CZ method (without applying magnetic field). The silicon single crystal was processed by a usual method to produce a CZ silicon wafer having a diameter of 200 mm, an initial interstitial concentration of 18 ppma (JEIDA), a nitrogen concentration of $8 \times 10^{13}$ number/cm$^3$ (calculated value) and a resistivity of 2500 Ω·cm.

This wafer was subjected to a heat treatment at 1100° C. for 2 hours and a heat treatment at 1000° C. for 16 hours under a 100% argon atmosphere and further subjected to heat treatments simulating a device production process (heat treatments at 1200° C. for 1 hour and at 450° C. for 5 hours) under a nitrogen atmosphere (mixed with 3% of oxygen) in a vertical type heat treatment furnace. For the silicon wafer obtained as described above, the residual interstitial oxygen concentration was measured by infrared absorption spectroscopy for the whole wafer, and it was confirmed that the residual interstitial oxygen concentration in the wafer was 8 ppma or less.

Thereafter, the wafer after the heat treatments was subjected to angle lapping, and then resistivity was measured by the spreading resistance measurement method for a portion from the surface to a depth of 100 μm. As a result, it was confirmed that every region in the wafer had a resistivity of 2000 Ω·cm or more. Subsequently, the surface undergone angle polishing was subjected to preferential etching and observed by using a optical microscope. As a result, the transition region had a narrow width of about 5 μm, i.e., a sharp profile, and the defect density in the oxygen precipitation region was a sufficient value, i.e., 5 to $8 \times 10^9$ number/cm$^3$. That is, it can be seen that the silicon wafer of Example 1 was a DZ-IG wafer scarcely influenced by the resistivity reduction due to the oxygen donor and having sufficient gettering ability.

Further, the surface of the wafer after the heat treatments was polished by about 3 μm, and density of COPs existing on the polished surface and having a size of 0.12 μm or more as the diameter were measured by using a particle counter (SP1, produced by KLA Tencor Corporation). The measured COP density was an extremely low density, i.e., 0.06 number/cm$^2$.

COMPARATIVE EXAMPLE 1

A silicon single crystal was pulled with the same conditions as those of Example 1 except that nitrogen was not doped, and processed by a usual method to produce a CZ silicon wafer having a diameter of 200 mm, an initial interstitial concentration of 18 ppma (JEIDA) and a resistivity of 2500 Ω·cm.

This wafer was subjected to a three-step heat treatment (DZ-IG treatment) comprising a heat treatment at 1150° C. for 4 hours, a heat treatment at 650° C. for 6 hours and a heat treatment at 1000° C. for 16 hours under a nitrogen atmosphere (mixed with 3% of oxygen) and further subjected to heat treatments simulating a device production process (heat treatments at 1200° C. for 1 hour and at 450° C. for 5 hours) in a vertical type heat treatment furnace. For the silicon wafer obtained as described above, the residual interstitial oxygen concentration was measured by infrared absorption spectroscopy for the whole wafer, and it was confirmed that the residual interstitial oxygen concentration in the wafer was 8 ppma or less.

Thereafter, the wafer after the heat treatments was subjected to angle lapping, and then resistivity was measured by the spreading resistance measurement method for a portion from the surface to a depth of 100 μm. As a result, it was confirmed that the resistivity was decreased to ten and several Ω·cm in a region of a depth of 20 to 40 μm from the surface. Subsequently, the surface undergone angle polishing was subjected to preferential etching and observed by using a opical microscope. As a result, the region in which resistivity was decreased substantially corresponded to the transition region. The interstitial oxygen concentration was confirmed again by infrared absorption spectroscopy only for the transition region, it was found that the region is a portion where the interstitial oxygen concentration exceeded 8 ppma ($4 \times 10^{17}$ atom/cm$^3$). Based on this, it is considered that the amount of interstitial oxygen becoming donor was large in that portion, thus the conductivity type was reversed from p-type into n-type, and therefore the resistivity was further decreased. The measurement of the interstitial oxygen concentration in the transition region by infrared absorption spectroscopy can be performed by, for example, a measurement method of using a bonded wafer obtained by eliminating the DZ layer by polishing, bonding the obtained surface to an FZ wafer and eliminating the oxide precipitate layer.

Further, the surface of the wafer after the heat treatments was polished by about 3 μm, and density of COPs existing on the polished surface and having a size of 0.12 μm or more as the diameter were measured by using a particle counter (SP1, produced by KLA Tencor Corporation). The measured COP density was 4.3 number/cm$^2$, which was substantially the same density as the density before the heat treatments.

EXAMPLE 2

Silicon wafers having nitride films were introduced raw material polycrystal, and a nitrogen-doped silicon single crystal was pulled by the MCZ method. The silicon single crystal was processed by a usual method to produce a CZ silicon wafer having a diameter of 200 mm, an initial interstitial concentration of 6 ppma (JEIDA), a nitrogen concentration of $9 \times 10^{13}$ number/cm$^3$ (calculated value) and a resistivity of 1500 Ω·cm.

This wafer was subjected to a heat treatment at 800° C. for 4 hours under a nitrogen atmosphere and a heat treatment at 1100° C. for 16 hours under an argon atmosphere (mixed with 3% of hydrogen) and further subjected to heat treatments simulating a device production process (heat treatments at 1200° C. for 1 hour and at 450° C. for 5 hours) in a vertical type heat treatment furnace. For the silicon wafer obtained as described above, the residual interstitial oxygen concentration was measured by infrared absorption spectroscopy for the whole wafer, and it was confirmed that the residual interstitial oxygen concentration in the wafer was 8 ppma or less.

Thereafter, the wafer after the heat treatments was subjected to angle lapping, and resistivity was measured by the spreading resistance measurement method for a portion from the surface to a depth of 100 μm. As a result, it was confirmed that every region in the wafer had a resistivity of 1000 Ω·cm or more. Subsequently, the surface undergone angle polishing was subjected to preferential etching and observed by using a optical microscope. As a result, the defect density in the oxide precipitate region was a sufficient value, i.e., 1 to $5 \times 10^8$ number/cm$^3$. That is, it can be seen that the silicon wafer of Example 2 was also a DZ-IG wafer scarcely influenced by the resistivity reduction due to the oxygen donor and having sufficient gettering ability, even though the silicon single crystal was grown with a low oxygen concentration.

Further, the surface of the wafer after the heat treatments was polished by about 3 μm, and density of COPs existing on the polished surface and having a size of 0.12 μm or more as the diameter were measured by using a particle counter (SP1, produced by KLA Tencor Corporation). The measured COP density was extremely low density, i.e., 0.1 number/cm$^2$.

COMPARATIVE EXAMPLE 2

A silicon single crystal was pulled with the same conditions as those of Example 2 except that nitrogen was not doped, and processed by a usual method to produce a CZ silicon wafer having a diameter of 200 mm, an initial interstitial concentration of 6 ppma (JEIDA) and a resistivity of 1500 Ω·cm.

This wafer was subjected to a three-step heat treatment (DZ-IG treatment) comprising a heat treatment at 1150° C. for 4 hours, a heat treatment at 650° C. for 6 hours and a heat treatment at 1000° C. for 16 hours under a nitrogen atmosphere (mixed with 3% of oxygen) and further subjected to heat treatments simulating a device production process (heat treatments at 1200° C. for 1 hour and at 450° C. for 5 hours) in a vertical type heat treatment furnace. For the silicon wafer obtained as described above, the residual interstitial oxygen concentration was measured by infrared absorption spectroscopy for the whole wafer, and it was confirmed that the residual interstitial oxygen concentration in the wafer was 8 ppma or less.

Thereafter, the wafer after the heat treatments was subjected to angle lapping, and resistivity was measured by the spreading resistance measurement method for a portion from the surface to a depth of 100 μm. As a result, it was confirmed that every region in the wafer had a resistivity of 1000 Ω·cm or more. However, when the surface undergone angle polishing was subjected to preferential etching and observed by using a optical microscope, the defect density in the oxide precipitate region was found to be extremely low, i.e., 1 to $5 \times 10^6$ number/cm$^3$. That is, it can be seen that, although the silicon wafer of Comparative Example 2 was a wafer not substantially influenced by the resistivity reduction due to the oxygen donor, it was a wafer that did not have sufficient gettering ability, since the silicon single crystal was grown with a low oxygen concentration, and thus oxygen precipitation was unlikely to occur in the bulk portion.

Further, the surface of the wafer after the heat treatments was polished by about 3 μm, and density of COPs existing on the polished surface and having a size of 0.12 μm or more as the diameter were measured by using a particle counter (SP1, produced by KLA Tencor Corporation). The measured COP density was 4.0 number/cm$^2$, which was substantially the same density as the density before the heat treatments.

The present invention is not limited to the embodiments described above. The above-described embodiments are mere examples, and those having the substantially same configuration as that described in the appended claims and providing the similar functions and advantages are included in the scope of the present invention.

The invention claimed is:

1. A method for producing a silicon wafer, which comprises growing a silicon single crystal ingot having a resistivity of 100 Ω·cm or more and an initial interstitial oxygen concentration of 10 to 25 ppma and doped with nitrogen by the Czochralski method, processing the silicon single crystal ingot into a wafer, and subjecting the wafer to a heat treatment so that a residual interstitial oxygen concentration in the wafer becomes 8 ppma or less.

2. A method for producing a silicon wafer, which comprises growing a silicon single crystal ingot having a resistivity of 100 Ω·cm or more and an initial interstitial oxygen concentration of 8 ppma or less and doped with nitrogen by the Czochralski method, processing the silicon single crystal ingot into a wafer, and subjecting the wafer to a heat treatment to form an oxide precipitate layer in a bulk portion of the wafer.

3. The method according to claim 1, wherein nitrogen is doped at a concentration of $1\times10^{12}$ to $5\times10^{15}$ number/cm$^3$.

4. The method according to claim 2, wherein nitrogen is doped at a concentration of $1\times10^{12}$ to $5\times10^{15}$ number/cm$^3$.

5. The method according to claim 1, wherein the heat treatment is performed at a temperature of 1000 to 1200° C. for 1 to 20 hours in hydrogen gas, argon gas or a mixed gas atmosphere of hydrogen gas and argon gas.

6. The method according to claim 2, wherein the heat treatment is performed at a temperature of 1000 to 1200° C. for 1 to 20 hours in hydrogen gas, argon gas or a mixed gas atmosphere of hydrogen gas and argon gas.

7. The method according to claim 3, wherein the heat treatment is performed at a temperature of 1000 to 1200° C. for 1 to 20 hours in hydrogen gas, argon gas or a mixed gas atmosphere of hydrogen gas and argon gas.

8. The method according to claim 4, wherein the heat treatment is performed at a temperature of 1000 to 1200° C. for 1 to 20 hours in hydrogen gas, argon gas or a mixed gas atmosphere of hydrogen gas and argon gas.

9. A silicon wafer produced by the production method according to claim 1.

10. A silicon wafer produced by the production method according to claim 2.

11. A silicon wafer produced by the production method according to claim 3.

12. A silicon wafer produced by the production method according to claim 4.

13. A silicon wafer produced by the production method according to claim 5.

14. A silicon wafer produced by the production method according to claim 6.

15. A silicon wafer produced by the production method according to claim 7.

16. A silicon wafer produced by the production method according to claim 8.

* * * * *